(12) United States Patent
Bertin et al.

(10) Patent No.: US 6,219,215 B1
(45) Date of Patent: Apr. 17, 2001

(54) CHIP THERMAL PROTECTION DEVICE

(75) Inventors: Claude Louis Bertin, South Burlington; Erik Leigh Hedberg, Essex Junction; Timothy Dooling Sullivan, Underhill; William Robert Tonti, Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,042

(22) Filed: Apr. 30, 1999

(51) Int. Cl.[7] ................................................ H02H 3/00
(52) U.S. Cl. ........................... 361/93.8; 361/104; 307/11
(58) Field of Search ............................... 361/78, 79, 93.1, 361/93.8, 104, 103; 307/80, 85, 86, 100, 23.25, 29, 31, 38, 44.64; 257/528, 530, 9

(56) References Cited

U.S. PATENT DOCUMENTS

| | | | |
|---|---|---|---|
| 4,089,734 | * 5/1978 | Bierig | 438/601 |
| 4,558,260 | 12/1985 | Masegi . | |
| 4,935,645 | 6/1990 | Lee . | |
| 5,153,802 | * 10/1992 | Mertz et al. | 361/18 |
| 5,291,139 | 3/1994 | Fruhauf et al. . | |
| 5,347,418 | 9/1994 | Ando et al. . | |
| 5,440,441 | * 8/1995 | Ahuja | 361/62 |
| 5,708,574 | * 1/1998 | Crompton | 363/53 |
| 5,723,999 | 3/1998 | Merritt . | |
| 5,764,466 | 6/1998 | Mangtani et al. . | |
| 5,812,477 | 9/1998 | Casper et al. . | |
| 6,141,245 | * 10/2000 | Bertin et al. | 365/185.05 |

* cited by examiner

Primary Examiner—Michael J. Sherry
Assistant Examiner—Kim Huynh
(74) Attorney, Agent, or Firm—Scully, Scott, Murphy & Presser; Howard J. Walter, Jr.

(57) ABSTRACT

A gap conducting structure for an integrated electronic circuit that functions as an electronic fuse device and that is integrated as part of the semi-conductor chip wiring for providing over-current and thermal runaway protection. The gap conducting structure includes one or more air gap regions of predefined volume that fully or partially exposes a length of interlevel conductor layer in an IC. Alternately, the air gap region may wholly located within the dielectric region below a corresponding conductor and separated by insulator. When functioning as a fuse, the gap region acts to reduce thermal conductivity away from the exposed portion of the conductor enabling generation of higher heat currents in the conducting line with lower applied voltages sufficient to destruct a part of the partially exposed/fully exposed conducting line, thus preventing thermal runaway and over-current condition. The presence of gaps, and hence, the fuses, are scalable and may be tailored to the capacity of currents they must carry with the characteristics of the fuses defined by a circuit designer.

10 Claims, 4 Drawing Sheets

CHIP THERMAL PROTECTION DEVICE

BACKGROUND OF THE INVENTION

1. Field of the Invention

The present invention relates to fuse structures in integrated circuits, and specifically, to a novel thermal fuse device and circuit architecture for providing thermal protection of semi-conductor chips and circuit structures.

2. Discussion of the Prior Art

Thermal runaway may occur in integrated circuit chips/devices due to the following reasons: 1) during a chip/device "burn-in" performed at high temperature (e.g., 140° C.–150° C.); 2) voltages above 1.5× operating voltages; or 3) if the chips go into latchup. Also, chips can experience current runaway, with accompanying heating and destruction when operating in systems.

While current fuse devices are manufactured as elements in semiconductor devices, i.e., IC chips, they are predominantly large and cumbersome requiring application of a laser stimuli for their fuse blowing. Typically, these fuses are applied in circuit trimming applications and/or removing unwanted or defective circuits prior to chip packaging. Currently, there is no thermal fuse protection device that is designed to protect integrated circuit devices from thermal run-away, latch-up, and over-current conditions during normal operation, and, that is capable of being blown at a pre-determined operating condition, e.g., a specified current and/or voltage level, for instance.

U.S. Pat. No. 4,272,753 discusses a method for fabricating a discrete metallic fuse device using fusible material which is necked to a narrow region. The fusible material is separated from an insulative layer by an air gap which provides lower thermal conductivity environment.

U.S. Pat. No. 4,089,734 discusses a metallic fuse device for read only memory and memory reconfiguration applications which involves a complicated technique including a four layer deposition of metallizations, requires the etching at two sides of a fusible link layer to form the resultant fusible link, and etching of the silicon substrate material to form a mesa structure.

U.S. Pat. No. 4,879,587 discusses manufacture of a metallic fuse device that is provided on top of a supporting insulating bridge structure for connecting two conductive regions.

The manufacture of each of the fuse devices described in the above-mentioned prior art is generally complicated requiring many processing steps. Additionally, they are treated as discrete elements, and are not integral with the conducting line itself. Further, these prior art fuse devices are not configured to destruct according to a designed voltage and current operating condition, and, do not readily detect thermal runaway phenomena that may occur in integrated circuits.

Accordingly, it would be highly desirable to provide a novel electrical fuse structure for integrated circuits that comprises actual conductive chip wiring and that may be easily blown at a specified voltage and current level, and, that may be used to provide thermal runaway and over-current protection for integrated circuit devices and structures.

It would additionally be highly desirable to provide a novel electrical fuse structure for integrated circuits that are defined by the designer and tailored to the capacity of currents they must carry.

SUMMARY OF THE INVENTION

It is an object of the invention to provide a novel electrical fuse structure for integrated circuits that comprises actual conductive chip wiring and, that may be used to provide thermal runaway protection and over-current protection for semi-conductor circuit devices and structures.

It is another object of the present invention to provide a novel high-performance signal line structure in integrated circuits having a locally minimized thermal conduction path below a conductor to the silicon substrate to enable a more controlled fusing activation at lower current and voltage levels.

Such fuses prevent excessive current/thermal build-up in the chip, even in case of a catastrophic event such as latchup, and enables immediate corrective action in case such an excessive current/thermal build-up condition is detected. The chip is self protected, and cannot damage the board, power supply, other chips, etc.

According to the principles of the invention, there is provided a current overload protection system for an integrated circuit chip having a power source comprising a current monitoring device for monitoring current between the power source and a node of an integrated circuit device in the chip, the current monitoring device existing in a first operating state when the current is at or below a predetermined value and existing in a second operating state when the current exceeds the predetermined value indicating current overload condition; and, a voltage detection circuit responsive to the first operating state of the current monitoring device for deactivating implementation of a second integrated circuit device in the chip that permits corrective action of the overload condition, and, responsive to the second operating state for activating the second integrated circuit device for enabling continuous operation of the integrated circuit chip.

Preferably, the invention employs a gap conducting structure for the integrated electronic circuit that functions as an electronic fuse device and that is integrated as part of the semi-conductor chip wiring for providing over-current and thermal runaway protection. The gap conducting structure includes one or more air gap regions of predefined volume that fully or partially exposes a length of interlevel conductor layer in an IC. Alternately, the air gap region may be wholly located within the dielectric region below a corresponding conductor and separated by insulator. When functioning as a fuse, the gap region acts to reduce thermal conductivity away from the exposed portion of the conductor enabling generation of higher heat currents in the conducting line with lower applied voltages sufficient to destruct a part of the partially exposed/fully exposed conducting line, thus preventing thermal runaway and over-current condition. The presence of gaps, and hence, the fuses, are scalable and may be defined by the designer and tailored to the capacity of currents they must carry.

BRIEF DESCRIPTION OF THE DRAWINGS

Further features, aspects and advantages of the apparatus and methods of the present invention will become better understood with regard to the following description, appended claims, and accompanying drawings where:

DETAILED DESCRIPTION OF THE PREFERRED EMBODIMENTS

The present invention is a novel thermal fuse structure that is integrated as part of the semi-conductor chip wiring and designed to prevent excessive current/thermal build-up in the chip. As will be described in greater detail, the thermal fuse structures themselves may be defined by the designer and tailored to the capacity of currents they must carry. Any chip incorporating the novel thermal fuse is self-protected, thus minimizing damage to the board, power supply, or other chips, etc. Furthermore, it is possible to recover from a failure and re-enable the chip for all types of fails.

A method for manufacturing the novel thermal fuse structure is described in commonly-owned, co-pending U.S. patent application Ser. Nos. 09/302,902 and 09/303,509 the whole contents and disclosure of each of which is incorporated by reference as if fully set forth herein. Basically, the design of the fuse is based on the principles described in the following reference: H. A. Schafft, "Thermal Analysis of Electromigration Test Structures", IEEE Transactions on Electron Devices, Vol. ED-34, No. 3, March 1987, the contents and disclosure of which is incorporated by reference as if fully set forth herein. The reference shows that the temperature of a doped polysilicon, silicided polysilicon line, or a metal line is given by equation (1) as follows:

$$T = T_{ambient} + \frac{(J^2) \cdot \rho}{((K_{therm\,cond} \cdot \text{Ratio of dimensions}) - (J^2) \cdot \rho \cdot B))} \quad (1)$$

where: $\rho$=resistivity of the metal in $\Omega$-cm;

J=current density in the metal in Amperes/cm$^2$;

$K_{thermal\,coefficient}$=thermal conductivity of the insulator in Watts/cm°K; and, B=temperature coefficient of resistivity.

As metal lines, doped polysilicon and silicided polysilicon in semi-conductor structures are thermally coupled to a silicon wafer by an insulator, and, as a silicon substrate itself is an excellent heat conductor and conducts sufficiently well to prevent the metal from heating, reliability problems associated with current densities are minimized and the integrity of the lines is maintained.

According to the invention, if segments of metal conductors are decoupled from the insulating material in order to make the $K_{thermal\,coefficient}$ coefficient of the insulator very small, the conductors may heat up. That is, the thermal coefficient in equation (1) may be controlled by design. The denominator of equation (1) comprises a thermal conduction portion minus a heating portion. If the thermal coefficient of conduction is reduced, it is possible to produce heating in the metal conductor with a small current, and cause rapid heating and evaporation of a line, e.g., polysilicon or metal, such as tungsten, aluminum, copper, etc. In fact, the current necessary to provide fusing may be adjusted by the structure.

Figure 1A:
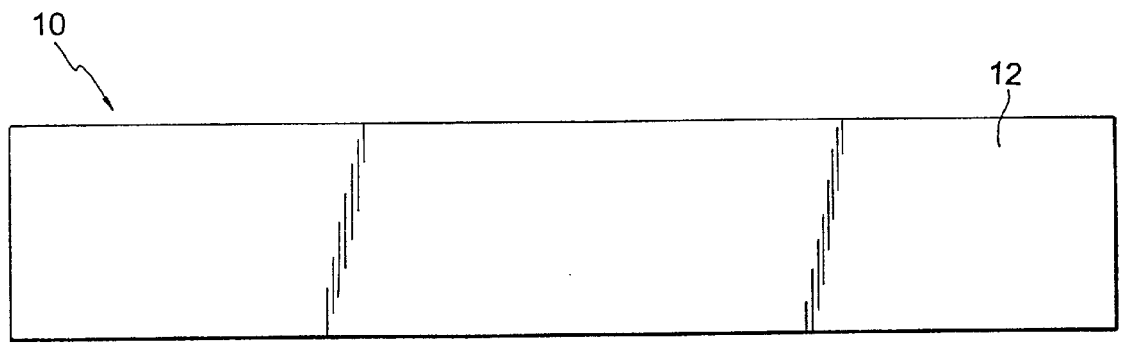
FIG. 1(a) illustrates a top-view illustration of the electronic fuse circuit of the invention.
Figure 1B:
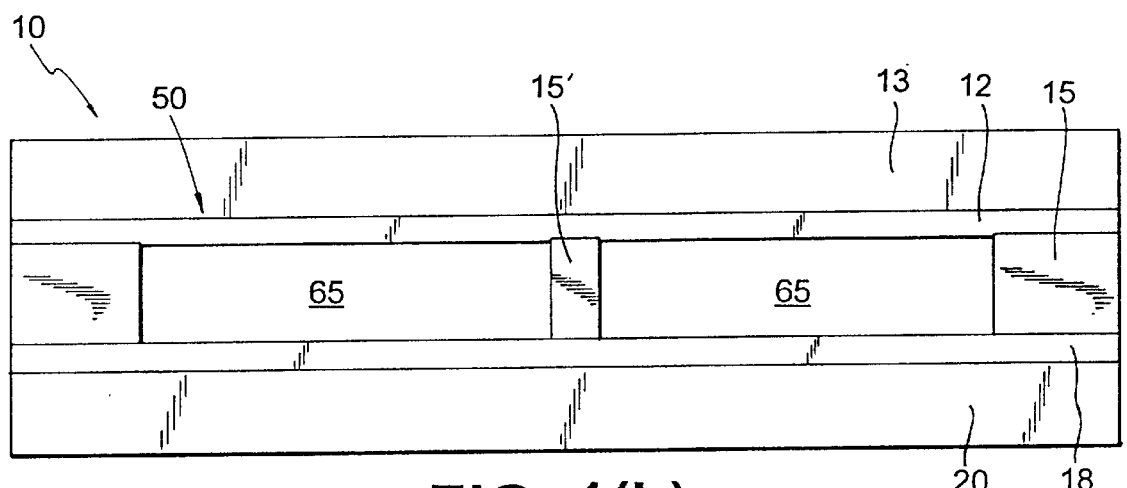
FIG. 1(b) illustrates a side-view illustration of the electronic fuse circuit having a conducting element partially exposed in a gap region.
Figure 1C:
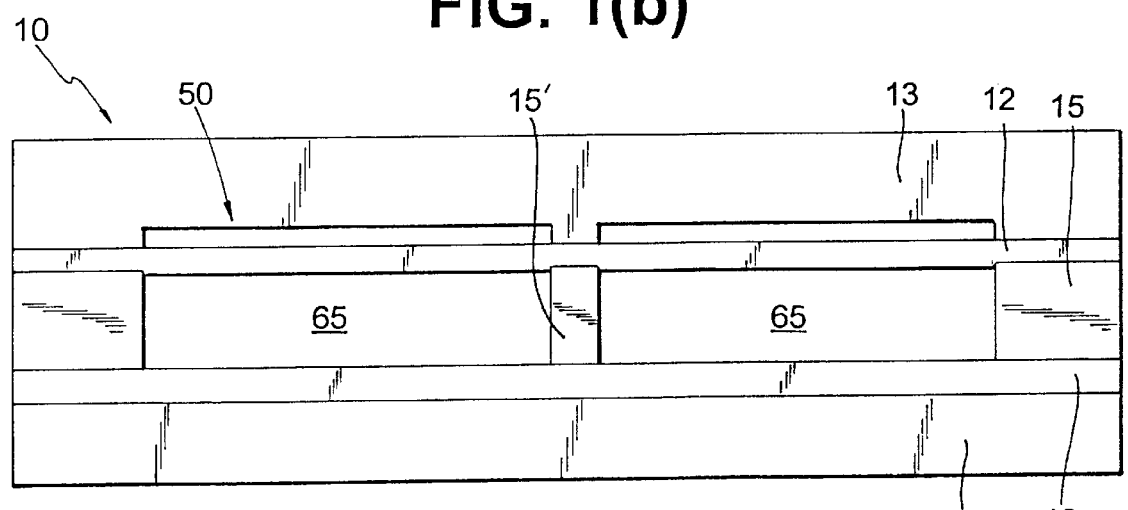
FIG. 1(c) illustrates a side-view illustration of the electronic fuse circuit having a conducting element fully exposed in a gap region.

FIG. 1(a) shows the top view of a metal line segment 10 including a metal layer or conductor 12 comprises of aluminum or copper, etc. FIG. 1(b) illustrates a cross section of the line segment 10 including the presence of first insulating layer 13, e.g., SiO$_2$ or like oxide, disposed atop of the conducting metal layer 12, second insulating layer 15, e.g., SiO$_2$ or like oxide, a third insulating layer 18, and, finally the silicon substrate 20. It should be understood that alternately, insulator 15 may be directly on the silicon substrate 20 obviating need for the insulator layer 18. As shown in FIG. 1(b), according to the invention, the thermal fuse element 50 comprises one or more gap(s) regions 65 that is/are created under a segment of the conductor 12, between the line and the silicon substrate, which have the effect of reducing the thermal conduction between the conductor 12 and the silicon substrate 20. As shown in FIG. 1(c), the thermal fuse conducting portion may be completely exposed within the gap 65. By decreasing the thermal conductivity between the conductor and the substrate, the line conductor 12 at the fuse location may be designed to "blow" at smaller currents, e.g., depending upon the application. That is, the thermal melting point of the conducting line 12 is reached faster, as a greater amount of heat is generated in the line at the fuse due to the presence of the gaps regions. It should be understood that there may be smaller insulating regions, such as insulator region 15' designed into the fuse 50 for separating gap regions and tailoring the thermal conductivity profile. It should also be understood that, if desired, the gap regions may comprise a dielectric material of low-level thermal conductivity. Additionally, a small layer of insulating material may separate a conductive layer from an air gap region, i.e, the gap does not have to touch the metal or reach it, but, rather may be below the metal with some insulative separation.

The air gaps 65 created under the conducting layer 12 and between the substrate 20 also provide a place for the "blown" melted conductor (metal, for example) to collect without stressing other parts of the structure. The first insulator layer 13 shown above the conductor line 12 provides structure for other metal layers, etc., but does not provide a significant thermal path to the silicon substrate.

As described in greater detail in commonly-owned, co-pending U.S. patent application Ser. No. 09/302.9023, the structure may be fabricated using a photo layer to open the gap 65 regions in insulator layer 15; the opening being temporarily filled with paralene and planarized. Then, metal is deposited over the insulator and paralene regions and the conductor is defined by etching. Then, the insulator 13 is deposited; a hole is etched to the paralene; the wafer is heated a temperature sufficient to vaporize the paralene (100 to 150°); the hole is filled and the surface is planarized.

Thus, given the design parameters according to equation (1), the line 12 may be adjusted to heat rapidly at five times (5×) the normal current, for example, to protect a circuit chip in the power supply path, or in a high current OCD path, etc.

Figure 2:
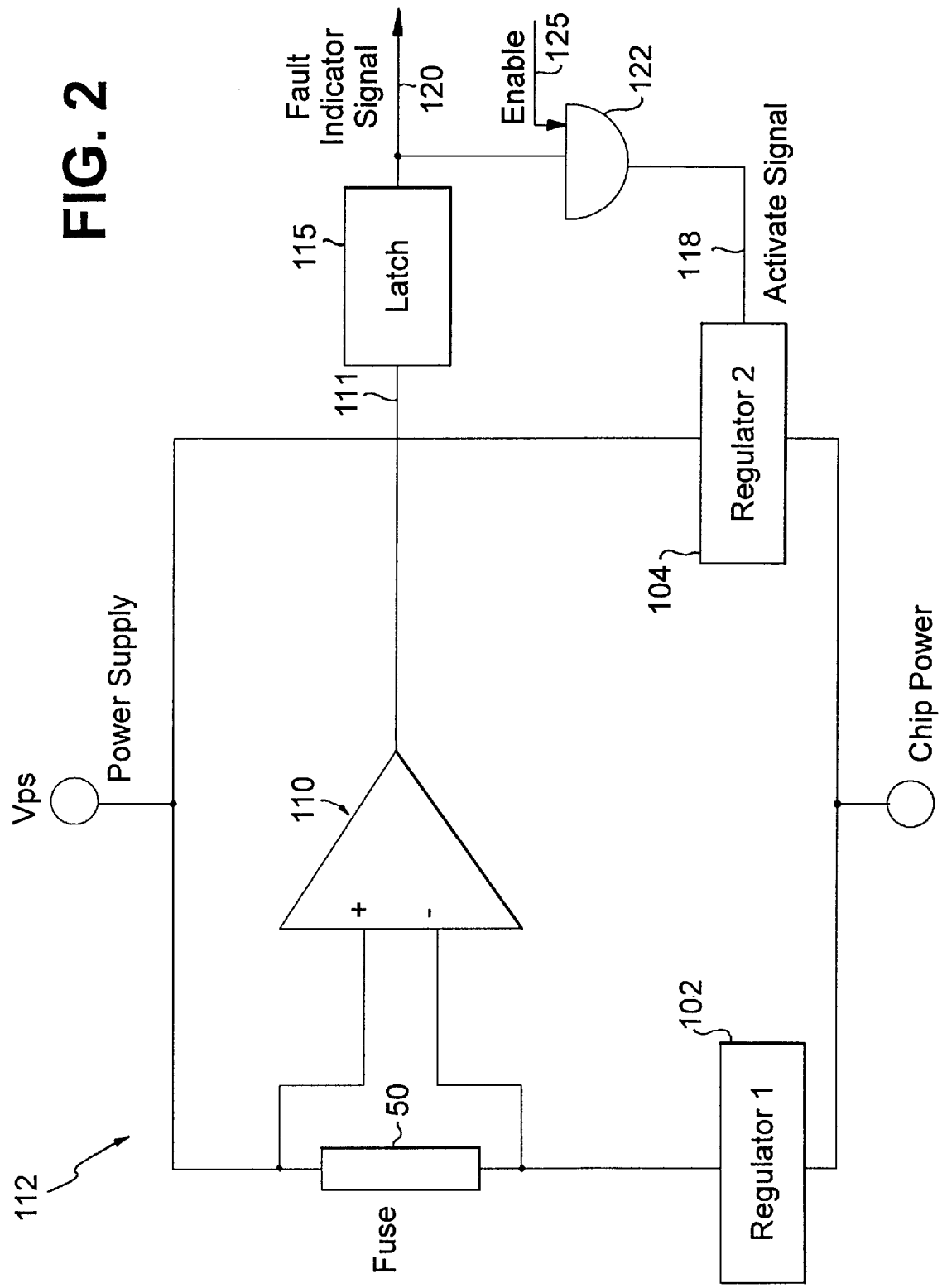
FIG. 2 illustrates a dual regulator power supply system for powering an integrated circuit ("chip") and employing the overcurrent protection capability provided by the novel thermal fuse device.

The overcurrent protection capability employing the thermal fuse is demonstrated by the dual regulator power supply system 112 which powers an integrated circuit ("chip") as shown in FIG. 2. In FIG. 2, the dual regulator circuit 112 employs two regulator devices 102 and 104 each connected to chip power (not shown) for regulating Vps (power supply) power applied to the chip. The thermal fuse device 50 of FIG. 1(b), for instance, is connected in series between the power supply Vps and the regulator 102. A differential comparator device 110 is provided with a terminal coupled to either end of the thermal fuse device 50 for monitoring the voltage difference across the terminals. As long as the thermal fuse is intact and passing current in normal operation, there is a minimum voltage drop across it. Thus, with proper bias, the comparator device 110 will output a logic '0' signal on line 111, which is used to provide a non-fault output indication 120 at the output of latch circuit 115. In the event of an over-current condition, e.g., a current demand surge due to a chip failure, latchup, etc., the thermal fuse 50 opens and the current conduction ceases. This condition results in the comparator device 110 sensing a significant voltage drop at its inputs which results in the flipping of its output signal, e.g., to a logic '1', on line 111, thus signaling a fault to latch 115. This process deactivates regulator device 102 and sets the stage for activation of regulator device 104. That is, some intervention, be it human, circuit, or otherwise, is needed to correct the over-voltage/current problem and toggle the enable line 125 to generate activate signal 118 which is used to fully activate the regulator 2. As shown in FIG. 2, an AND gate 122 is provided to receive the latch output 120 input and the enable input 125 in order to generate activate signal 118 for activating the regulator device 104.

Though the application of FIG. 2 depicts one stage of operation, it is understood that multiple stages of the circuit 100 may be connected such that several regulators may be added as back-up in a more sophisticated fault tolerant system. This concept may additionally be applied to other circuit functions such as receivers, memory controllers, disk drives, modems, whole computer systems, communication systems, satellite systems, etc.

Figure 3:
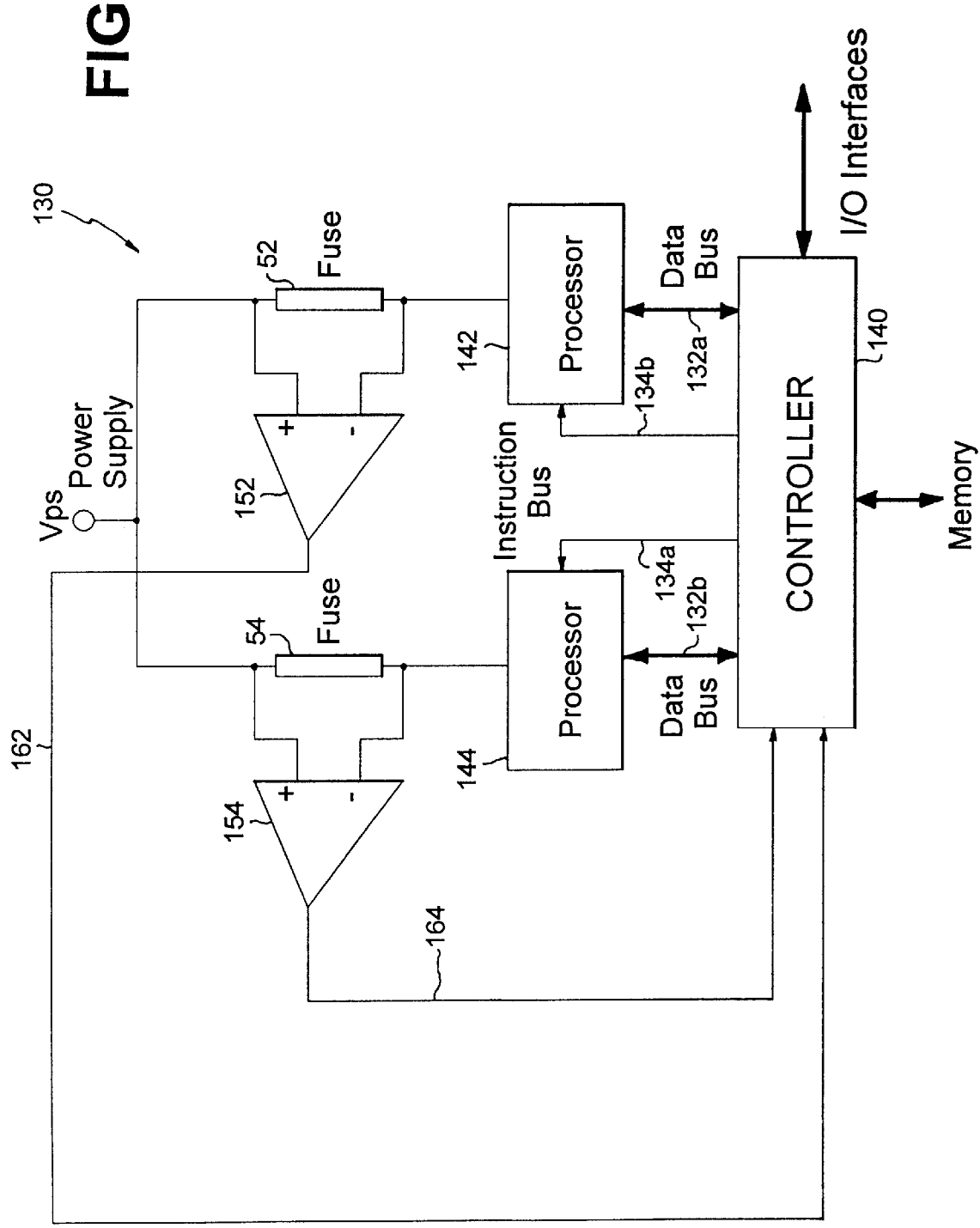
FIG. 3 illustrates a dual-/multi-processor (CPU) system employing overcurrent protection circuitry including the novel thermal fuse device.

The overcurrent protection capability employing the thermal fuse is now demonstrated by a dual-/multi-processor (CPU) system 130 of FIG. 3 which includes a controller device 140 for controlling operation of two (or more) parallel operating processors 142 and 144. As shown in FIG. 3, the controller 140 additionally controls parallel data bus lines 132a,b, parallel instruction bus lines 134a,b for controlling data and instruction flow to each respective parallel processor. In this application, the power supply Vps provides power to each processor 142, 144 via a respective thermal fuse device 52, 54. A respective differential comparator device 152, 154 is provided across each thermal fuse 52, 54 having respective input terminals coupled to either end of its corresponding thermal fuse device for monitoring the voltage difference across the terminals. As long as the thermal fuse is intact and passing current in normal operation, there is a minimum voltage drop across it. Thus, with proper bias, if operation is normal, the voltage drop is zero, and each respective comparator device 152, 154 will output a logic '0' signal on lines 162, 164 respectively, which is used to provide a non-fault output indication to the controller device 140. In the event the processor overheats, or an over current condition exists in the processor, the thermal fuse device will blow and its respective comparator device will toggle, as herein described, and send a signal to the controller 140 indicating that the processor is faulty. The controller may thereafter take appropriate action, e.g., re-direct the task instructions sets and data intended for receipt by the faulty processor to a properly functioning processor. It should be understood that, although only two processors are shown in the example of FIG. 3, the principles described herein may apply to multi-processing systems having six or more parallel processors.

Figure 4:
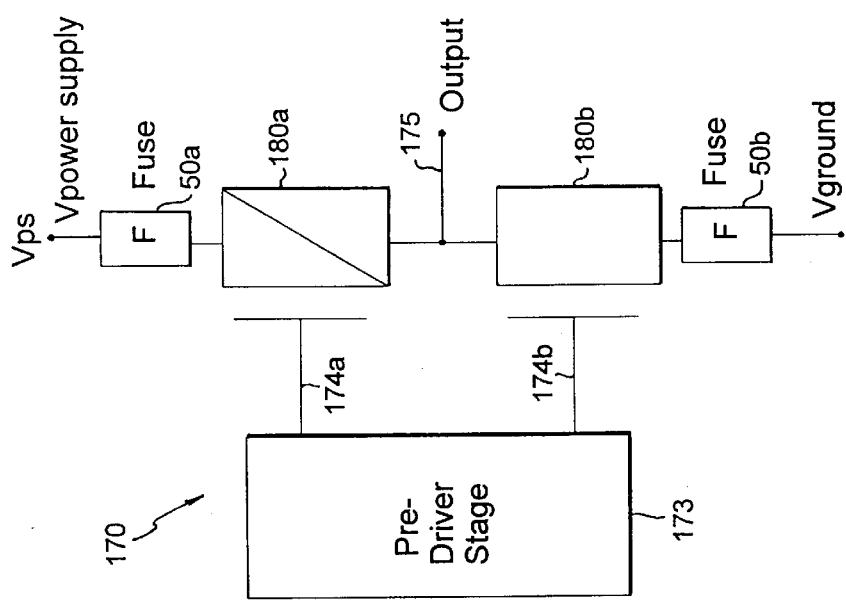
FIG. 4 illustrates an OCD drive amplifier stage employing overcurrent protection capability.

FIG. 4 illustrates a further application of the overcurrent protection capability provided by the thermal fuse employed in an off-chip device (OCD) drive amplifier stage 170. In operation, a pre-driver gain stage 173 is provided having outputs 174a, 174b for driving a bus output 175. Respective outputs 174a, 174b are input to respective transistor devices 180a (e.g., P-FET), and 180b (e.g., N-FET), capable of handling large currents (100 ma, for example) for driving the output bus 175. A first thermal fuse device 50a is in series with a power source Vps, and connected between the power source and a PMOS "drive" transistor 180a; second thermal fuse device 50b is in series between the NMOS "sink" transistor 180b and ground. Given a tendency of increasingly smaller and scaled P-MOS transistors devices to exhibit a thermal runaway condition and consequent heating and current increase, the fuse 50a in series with Vps is designed to open, thus, protecting the PMOS drive device 180a. Fuse device 50b is similarly provided for to NMOS transistor 180b. Thus, not only is the transistor device itself protected, but so is the board that the chip is mounted on.

Figure 5:
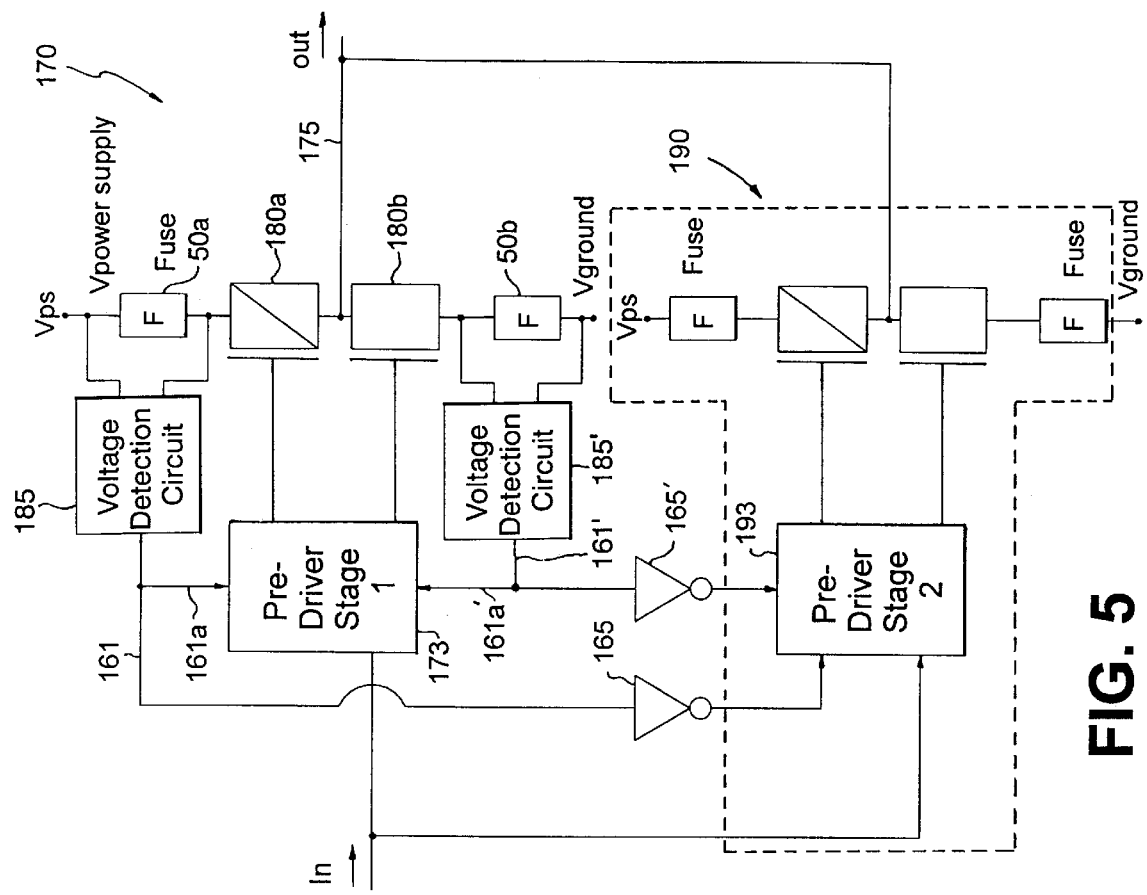
FIG. 5 illustrates the provision of the OCD drive amplifier stage coupled with a second identical drive amplifier stage having a common output and implementing over-current protection for PMOS and NMOS devices.

FIG. 5 illustrates an OCD pre-drive amplifier stage 170 of FIG. 4 coupled with a second identical pre-drive amplifier stage 190 that is also fused, whose output is common to the same node 175. As in FIG. 4, each stage circuit implements fuse monitoring devices 50a, 50b for protecting respective PMOS "drive" transistor 180a and NMOS "sink" transistor 180b. When the first pre-driver stage 170 switches off, e.g., due to an over-current/thermal runaway condition, for example, then the gain stage 193 of second pre-driver stage 190 automatically turns on. Thus, as described herein with respect to the overcurrent protection capability employing the thermal fuse as demonstrated by the dual regulator system of 112 of FIG. 2, a voltage detection circuit 185 comprising the differential comparator device (not shown) having terminals coupled to either end of the thermal fuse device 50a for monitoring the voltage difference across the terminals is provided along with a latch circuit (not shown) for latching the comparator output signal indicating existence of an over-current/thermal runaway condition. As long as the thermal fuse is intact and passing current in normal operation, there is no voltage drop across it. Thus, with proper bias, the comparator device of the voltage detection circuit 185 will output a logic '0' signal on line 161, which during normal operation, is used to provide a non-fault output indication. In the event of an over-current condition, e.g., a current demand surge due to a chip failure, latchup, etc., the thermal fuse 50a opens and the current conduction ceases. This condition results in the voltage detection circuit 185 sensing a significant voltage drop at its inputs which results in the toggling of its output signal, e.g., to a logic '1' signal on line 161, thus signaling a fault. This process deactivates the driver stage 173 for the PMOS transistor 180a via signal line 161a and simultaneously activates PMOS driver stage provided in pre-drive amplifier stage 193 through inverter 165. Likewise, a voltage detection circuit 185' comprising the differential comparator device (not shown) having terminals coupled to either end of the thermal fuse device 50b for monitoring the voltage difference across the terminals is provided along with a latch circuit (not shown) for latching the comparator output signal indicating existence of an over-current/thermal runaway condition. Again, as long as the thermal fuse is intact and passing current in normal operation, there is no voltage drop across it. Thus, with proper bias, the comparator device of the voltage detection circuit 185' will output a logic '0' signal on line 161', which during normal operation, is used to provide a non-fault output indication. In the event of an over-current condition, e.g., a current demand surge due to a chip failure, latchup, etc., the thermal fuse 50b opens and the current conduction ceases. This condition results in the voltage detection circuit 185' sensing a significant voltage drop at its inputs which results in the toggling of its output signal, e.g., to a logic '1' signal on line 161', thus signaling a fault. This process deactivates the signal to the NMOS device in driver stage 173 via signal line 161a' and simultaneously activates the driver for NMOS device of gain stage 193 of pre-driver stage 190 through an inverter 165'.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

Having thus described our invention, what we claim as new, and desire to secure the Letters Patent is:

1. A current overload protection system for an integrated circuit chip having a power source connected to at least one power regulator circuit, said system comprising:

a thermal fuse structure formed in said integrated circuit for monitoring current flow between said power source and a first power regulator circuit, said thermal fuse structure enabling said current flow when said current is at or below a predetermined value and destructing when said current exceeds said predetermined value indicating current overload condition; and, a voltage detection circuit responsive to said destructing of said thermal fuse structure for permitting corrective action of said overload condition, said corrective action including automatically activating a second power regulator circuit for enabling continuous operation of said integrated circuit chip.

2. The current overload protection system as claimed in claim 1, wherein said thermal fuse structure includes a semiconductor substrate, a portion of a conducting line in said integrated circuit chip, an interlevel dielectric formed between said conducting line and said substrate, and, an air gap formed within said interlevel dielectric and partially exposing a portion of said conducting line in said gap, wherein said gap acts to reduce thermal conductivity away from the exposed portion of said conductor enabling said exposed conducting line portion to open at a desired current level.

3. The current overload protection system as claimed in claim 2, wherein said conducting line portion is completely exposed in said gap, said gap acting to reduce thermal conductivity away from the exposed portion of said conductor enabling said exposed conductor portion to destruct at a desired current level.

4. The current overload protection system as claimed in claim 2, wherein said gap is formed entirely in said interlevel dielectric beneath said conducting line portion, said gap enabling generation of higher heat current in said conducting line portion sufficient to destruct said conducting line portion at a desired current level.

5. The current overload protection system as claimed in claim 2, wherein said air gap is of a width dimension extending substantially for the width of said conducting line portion, and is of a length dimension substantially corresponding to a length of said conducting line portion.

6. The current overload protection system as claimed in claim 2, wherein said voltage detection circuit comprises a comparator device having first and second terminals connected across said thermal fuse structure, said comparator device generating a first output signal during said current flow monitoring, and generating a second output at a time of said destructing for permitting said corrective action.

7. A current overload protection system for an integrated circuit chip having a power source for powering two or more parallel operating processor devices, and a control device for controlling each said parallel operating processor, said system comprising:

a respective thermal fuse structure formed in said integrated circuit for monitoring current flow between said power source and each respective said parallel processor device, each said thermal fuse structure enabling said current flow when said current is at or below a predetermined value and destructing when said current to said processor exceeds said predetermined value indicating current overload condition; and, a voltage detection circuit associated with each parallel processor device and responsive to a destructing of a thermal fuse structure associated therewith for generating an output signal, whereupon detection of a destructing thermal fuse structure associated with a first parallel processor device, said control device being responsive to said output signal for enabling seamless performance of first processor operations by a second parallel operating processor device.

8. A current overload protection system for an integrated circuit chip having two or more bus driving circuits connected in parallel for driving a single output bus, a single bus driving circuit being activated at a time, and a power source for powering a respective output driving stage for driving said single output bus, said system comprising:

a thermal fuse structure formed in said integrated circuit for monitoring current flow between said power source and output driving stage associated with said activated bus driving circuit, said thermal fuse structure enabling said current flow when said current is at or below a predetermined value and destructing when said current to said output driving stage exceeds said predetermined value indicating current overload condition; and, a voltage detection circuit associated with said output driving stage of said activated bus driving circuit and responsive to a destructing of said thermal fuse structure for generating an output signal, wherein said second bus driving circuit is responsive to said output signal for activating the second bus driving circuit and enabling seamless operation of said single output bus during an overload condition in said first bus driving circuit.

9. A method for protecting an integrated circuit (IC) chip from an over-current condition, said chip having a power source connected to one or more parallel operating circuit devices, said method comprising:

integrating a thermal fuse structure as part of IC chip wiring for monitoring current flow between said power source and a first operating circuit device in said chip, said fuse device destructing when monitored current exceeds a predetermined value indicating current overload condition;

detecting destruction of said current thermal fuse structure and generating an output signal in response thereto; and, receiving said generated output signal and activating a second of said parallel operating devices on said chip to enable seamless operation of said IC chip.

10. A current overload protection system for an integrated circuit chip having a power source connected to one or more parallel operating circuit devices, said system comprising:

a thermal fuse structure formed in said integrated circuit for monitoring current flow between said power source and a first operating circuit device, said thermal fuse structure enabling said current flow when said current is at or below a predetermined value and destructing when said current exceeds said predetermined value indicating current overload condition and deactivation of said first operating circuit device; and, a voltage detection circuit responsive to said destructing of said thermal fuse structure for generating an output signal, a second of said parallel operating circuit devices of said integrated circuit chip automatically activated in response to said generated output signal to enable seamless operation of said chip.

* * * * *